US006852985B2

(12) United States Patent
Cowan et al.

(10) Patent No.: US 6,852,985 B2
(45) Date of Patent: Feb. 8, 2005

(54) METHOD AND APPARATUS FOR NANOMETER-SCALE FOCUSING AND PATTERNING OF ULTRA-LOW EMITTANCE, MULTI-MEV PROTON AND ION BEAMS FROM A LASER ION DIODE

(76) Inventors: Thomas E. Cowan, 2220 Schooner Cir., Reno, NV (US) 89509; Markus Roth, Sandgasse 6, Griesheim (DE), 64347; Patrick Audebert, 3 Rue de la Concorde, Palaiseau (FR), 91120

( * ) Notice: Subject to any disclaimer, the term of this patent is extended or adjusted under 35 U.S.C. 154(b) by 80 days.

(21) Appl. No.: 10/361,152

(22) Filed: Feb. 5, 2003

(65) Prior Publication Data

US 2004/0018700 A1 Jan. 29, 2004

Related U.S. Application Data

(60) Provisional application No. 60/355,476, filed on Feb. 5, 2002.

(51) Int. Cl.[7] .......................... H01L 21/26; C23C 14/00; H01J 49/16

(52) U.S. Cl. ............................... 250/423 P; 250/423 R; 250/424; 250/396 R

(58) Field of Search ......................... 250/423 P, 423 R, 250/424, 396 R; 315/111.21

(56) References Cited

U.S. PATENT DOCUMENTS 4,597,933 A * 7/1986 Ripin et al. ................. 376/153
4,664,769 A * 5/1987 Cuomo et al. ........... 204/192.1

OTHER PUBLICATIONS

Hatchett et al., *Electron, Photon, And Ion Beams From The Relativistic Interaction Of Petawatt Laser Pulses With Solid Targets,* Physics of Plasmas, May 2000, pp. 2076–2082, vol. 7, No. 5, American Institute of Physics.

Murakami et al., *Observation Of Proton Rear Emission And Possible Gigagauss Scale Magnetic Fields From Ultra–Intense Laser Illuminated Plastic Target,* Physics of Plasmas, Sep. 2001, pp. 4138–4143, vol. 8, No. 9, American Institute of Physics.

Wilks, S.C. et al., *Energetic Proton Generation In Ultra–Intense Laser—Solid Interactions,* Physics of Plasmas, Feb. 2001, pp. 542–549, vol. 8, No. 2, American Institute of Physics.

* cited by examiner

*Primary Examiner*—Nikita Wells
(74) *Attorney, Agent, or Firm*—Fitch, Even, Tabin & Flannery

(57) ABSTRACT

Methods and apparatus for focusing proton and ion beams within the profile of the beam envelope of an ultra-low emittance, charge neutralized emission to create a pattern without focusing the entire beam envelope or rastering. In one implementation, a method for use with laser accelerated ion beams comprises the steps: irradiating a surface of a target with pulsed laser irradiation to produce an electron plasma emission on a non-irradiated surface of the target, the electron plasma emission producing an ion beam emission on the non-irradiated surface, the ion beam emission having a beam envelope; and focusing ions of the ion beam emission into a plurality of component beams within the beam envelope as a result of the shape of the non-irradiated surface of the target.

30 Claims, 12 Drawing Sheets

Phase I- Virtual Cathode

Phase II- Quasineutral Plasma Expansion

1002

1002

1002

METHOD AND APPARATUS FOR NANOMETER-SCALE FOCUSING AND PATTERNING OF ULTRA-LOW EMITTANCE, MULTI-MEV PROTON AND ION BEAMS FROM A LASER ION DIODE

This application claims the benefit of U.S. Provisional Application No. 60/355,476, entitled NANOMETER-SCALE FOCUSING AND PATTERNING OF ULTRA-LOW EMITTANCE, MULTI-MeV PROTON AND ION BEAMS FROM A LASER ION DIODE, of Cowan, et al., filed Feb. 5, 2002, the disclosure of which is incorporated herein by reference.

FIELD OF THE INVENTION

The present invention relates to ion beam technology, more specifically to ion beam technology coupled with micromachining and lithographic techniques. Even more specifically, the present invention relates to the laser-plasma acceleration of multi-MeV protons and ions having ultra-low emittance using pulsed laser radiation.

BACKGROUND OF THE INVENTION

There are many applications of ion beam technology which suffer limitations on focusability due to beam emittance and space charge effects. For example, conventional ion lithography and implantation techniques consist of the radio frequency (RF) acceleration of an ion beam and then focusing the ion beam to a small focal point using optics. The focused beam is then rastered across the implantation sample in a particular pattern. The achievable spatial resolution depends on the focal spot size, which depends on the focusing optical elements (magnetic and electrostatic lenses) and on the ion beam current due to repulsive space charge forces in the beam. High spatial resolution (small focal spot size) requires reduced current. In turn, the reduced current lengthens the exposure time. Writing a pattern with the ion beam requires rastering the ion beam across the sample.

In some techniques, rather than rastering an optically focused ion beam, the ion beam is patterned into a desired pattern by applying a mask in the path of the ion beam. The mask simply blocks portions of the ion beam allowing the patterned portion to be transmitted to the sample. One example using a mask structure in which the expanding plasma induces electric fields in the mask dielectric material to micro-focus the beam is described in Ruhl, et al., "Probing of Electromagnetic Field with Laser Generated Proton Beams", Deutsches Patent und Markenamt Berlin, Aktenzeichen: 101 48 613.8 (2001), which is incorporated herein by reference.

The laser acceleration of ions is well known in the art and includes extensive research on laser ablation. Such techniques involve the expansion of hot plasma into a vacuum, as a result of laser-irradiation of a surface, and the coupling of the recoil momentum to drive implosions. This plasma expansion is from the front, laser-irradiated surface of the target, which is not suitable for high quality ion beam production. Such methods relying on laser ablation are conventionally used in laser machining and material modification, and are not well suited to lithography techniques.

As illustrated in FIG. 1 and as indicated in recent research, short-pulse laser irradiation of thin foils produces extremely low transverse beam emittance, and an essentially completely charge-neutralized beam from the non-irradiated side of the thin foils. This laser acceleration mechanism is related to the so-called Target Normal Sheath acceleration process first identified by Wilks et at., "Energetic Proton Generation in Ultra-Intense Laser-solid Interactions", Phys. Plasmas, Vol. 8, pg. 542 (2001), and Hatchett et al., Phys. Plasmas, Vol. 7, pg. 2076 (2000), both of which are incorporated herein by reference. As illustrated in FIG. 1, short pulse laser-irradiation 102 is directed on a target 104, e.g., a thin metallic foil. This irradiation 102 produces an ablation plasma 106 expanding from the front or irradiated surface 108 of the target 104. Also generated is a high-density (e.g., $10^{19}$–$10^{20}$ $cm^3$) of hot, MeV electrons 109, which penetrate the target 104, enveloping the target 104 and producing an electron plasma sheath 110 on the rear, non-irradiated surface 112 of the target 104. The electric field from the charge separation in this sheath 110 is on the order of the hot electron temperature (MeV), divided by the spatial scale length of the sheath (~micrometer), e.g., equal to approximately $10^{12}$ V/m (TV/m). This is sufficient to field ionize atoms in a thin layer on the rear surface 112 of the target 104, either protons from the bulk material 104, contaminants (such as hydrocarbons or water vapor), or purposefully deposited ion source material 114 (e.g., CaF). This rear-surface collimated emission 116 (i.e., the ionized atoms on the non-irradiated surface 112 of the target 104) does not suffer the space charge limitations of conventional non-neutralized beams. Thus, very high currents and current densities can be produced, much in excess of conventional RE acceleration techniques, while producing a proton beam quality having an emittance comparable to conventional RF accelerators.

Following ionization, the positive ions or protons (e.g., illustrated as $F^{7+}$ ions) are accelerated by the charge separation field, are analogous to a virtual cathode effect (see FIG. 2A which illustrates "Phase I" following ionization). FIG. 2A is a density vs. distance plot, where the distance z extends along an axis normal to the target surface and increasing along a direction of the expansion of the proton and ion beam. It is seen that due to the hot electron emission indicated as the curved portion of the hot electron density curve $n_{hot}$, positive charges accumulate at the boundary of the target (indicated as the positive charges on the right side of the ion (and proton) density curve $n_{ion}$).

As the ion density scale length increases (by expansion from the initially solid surface) to the order of the hot electron scale length, the ions (e.g., $F^{7+}$ ions) co-mingle with the hot electrons (e.g., $e^-$) and become a quasineutral plasma (FIG. 2B, "Phase II"). The quasineutral plasma including ions and protons as well as electrons continues to accelerate outward from the rear non-irradiated surface of the target 104 due to the ambipolar electric field. The commingling of ions/protons and electrons is illustrated at region 202 as the region to the right of the $n_{cold}$ curve and shared by the $n_{hot}$ and $n_{ion}$ curves.

The quasineutral plasma expansion accelerates the ions and protons to energies of several times the hot electron temperature, i.e., many MeV. Up to 50 MeV protons, and 100 MeV Fluorine ions have been observed in various experiments. The quasineutral expansion can be extremely laminar, and leads to a smoothly expanding plasma. The radial expansion is determined by the initial spatial distribution of the hot electron sheath 110 on the rear surface of the target 104. It is customary to assume Boltzmann equilibrium for the distribution of the hot electrons (although this may not strictly be correct for the very early, few femtosecond time scale of the sheath 110 formation and virtual cathode phase of ion acceleration). By the Boltzmann relation, the hot electron density, $n_{hot}$, is related to the potential, $\phi$, by $$n_{hot}=n_0\exp(e\phi/kT_{hot}). \quad \text{(Eq. 1)}$$

where $n_0$ is hot electron density in the center of the target 104, k is Boltzmanns constant, and $T_{hot}$ is the temperature of the hot electrons. One may express the electric field $E_x=-\partial_x\phi$, by the logarithmic derivative of $n_{hot}$, that is, $$E_x=-kT_{hot}(n_{hot}^{-1}\partial_x n_{hot}). \quad \text{(Eq. 2)}$$

where $\partial_x$ is the hot electron scalelength. In the quasineutral regime, the electric field can be expressed by substituting $n_{ion}\sim n_{hot}$ into Eq. 2. As long as the initial hot electron distribution is spatially smooth, radially symmetric, and either constant or monotonically decreasing with radius, the ion expansion exhibits laminar behavior, and the beam emittance is sufficiently low. The quasineutral plasma acceleration (including both accelerated ions/protons and electrons) decreases in time as $T_{hot}$ is reduced by the coupling of electron energy into the expanding ions and by radiative (i.e., Bremsstrahlung) and ionization processes in the bulk substrate material as the electrons oscillate through the bulk target material; and as the scale length of the ion (and hot electron) density increases due to the expansion.

It has been suggested that the entire beam envelope of the accelerated beam of protons and ions may be focused through the proper shaping of the rear surface of the target in order to produce a rasterable or scannable beam for lithographic and/or implantation applications. See Wilks et al., "Energetic Proton Generation in Ultra-Intense Laser-solid Interactions", Phys. Plasmas, Vol. 8, pg. 542 (2001), which has been previously incorporated by reference herein. As theoretically illustrated in FIGS. 3A–3D, the non-irradiated surface 304 of the target foil 302 has been shaped to focus the entire beam envelope. As illustrated in FIG. 3A, a hemispherical portion 306 of the rear surface 304 of the target 302 has been removed, such that as illustrated theoretically in FIGS. 3B and 3C, that the entire beam envelope of the ion accelerated beam is focused, e.g., focused beam 308. FIG. 3D theoretically illustrates the ion beam intensity at the focus point for such a focused beam 308. Such a focused beam 308 would then be used as a raster to create a desired pattern in a sample material.

However, as illustrated in FIG. 4, this ballistic focusing of the entire beam envelope has so-far proven to be extremely difficult because one must compensate for the natural divergence of the beam envelope due to the electron sheath density gradients. In other words, the shape of the rear surface of the target 302 must compensate for the spatial distribution of the initial laser produced electron density 402 produced by the laser irradiation (i.e., the MeV electrons $e^-$ in FIG. 1 that produce the sheath 110). Sufficient control and reproducibility of the sheath distribution has not yet been achieved; thus, no one has been able to successfully focus the entire beam envelope as theoretically illustrated in FIGS. 3A–3D.

It is with respect to these and other background information factors that the present invention has evolved.

SUMMARY OF THE INVENTION

The present invention advantageously addresses the needs above as well as other needs by providing a method and apparatus for focusing proton and ion beams within the profile of the beam envelope of an ultra-low emittance, charge neutralized emission to create a pattern without focusing the entire beam envelope or rastering.

In one embodiment, the invention may be characterized as a method for use with laser accelerated ion beams and a means for accomplishing the method, the method comprising the steps: irradiating a surface of a target with pulsed laser irradiation to produce an electron plasma emission on a non-irradiated surface of the target, the electron plasma emission producing an ion beam emission on the non-irradiated surface, the ion beam emission having a beam envelope; and focusing ions of the ion beam emission into a plurality of component beams within the beam envelope as a result of the shape of the non-irradiated surface of the target.

In another embodiment, the invention may be characterized as a device for focusing laser accelerated ion beams comprising a target having a surface configured to be irradiated with pulsed laser irradiation; and a non-irradiated surface configured to produce an electron plasma emission upon the irradiation of the surface, the electron plasma emission producing an ion beam emission having a beam envelope. A portion of the non-irradiated surface is shaped to focus ions of the ion beam emission into respective component beams within the beam envelope.

BRIEF DESCRIPTION OF DRAWINGS

Corresponding reference characters indicate corresponding components throughout the several views of the drawings.

DETAILED DESCRIPTION OF THE INVENTION

Figure 1:
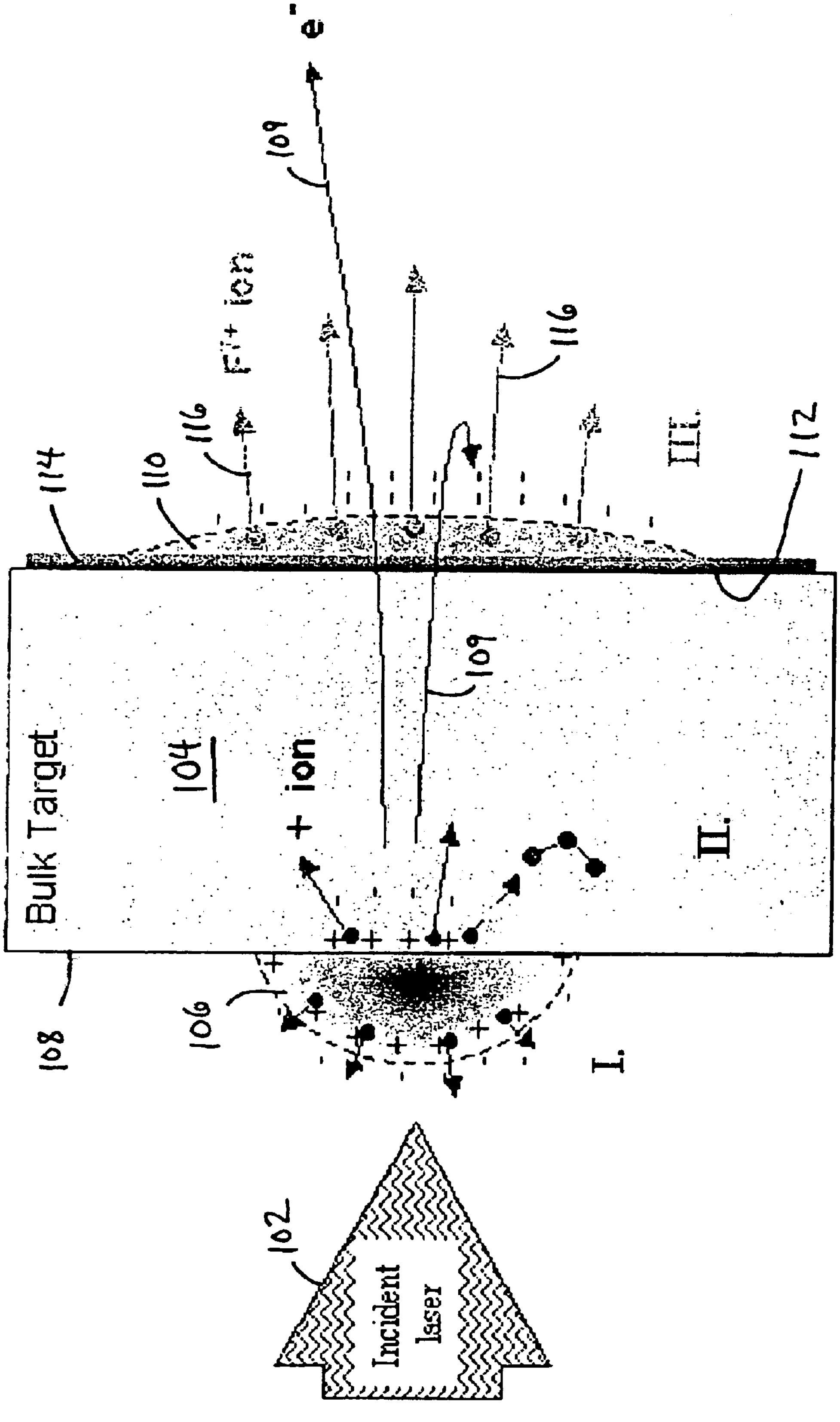
FIG. 1 illustrates proton and ion acceleration and the relativistic laser-solid interactions when a conductive target foil is irradiated with pulsed laser radiation as is conventionally known.
Figure 5A:
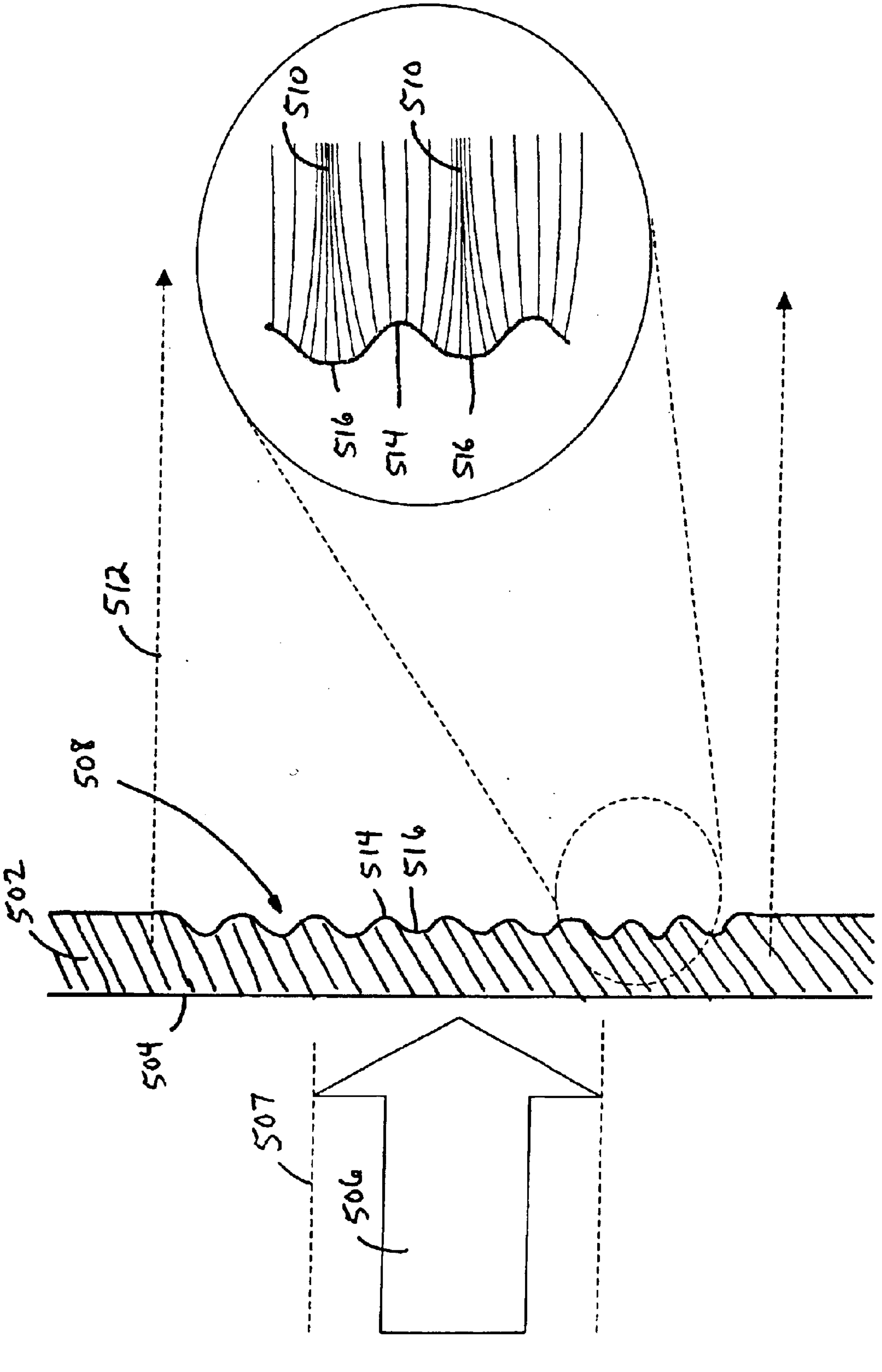
FIG. 5A illustrates a cross sectional view of a target, such as a conductive target foil, according to one embodiment of the present invention system for focusing proton and ion beams within the profile of the beam envelope of the proton and ion emission of FIG. 1.

Referring first to FIG. 5A, a cross sectional view is shown of a target, such as a conductive target foil, according to one embodiment of the present invention system for focusing proton and ion beams within the profile of the beam envelope of the emission of FIG. 1. In one embodiment, the target 502 is a conductive material, preferably a thin conductive foil. For example, in some embodiments, the target 502 is a thin conductive metallic foil comprising gold (Au) or Aluminum (Al), although it is understood that the target may comprise any conductive material, any conductive metallic material, conductive non-metallic material or conductive combination of any such materials. The front or irradiated surface 504 of the target 502 is irradiated with short pulse laser irradiation 506. The non-irradiated surface 508 (also referred to as the rear surface of the target 502) is shaped such that the ions, e.g., ions and protons, that are emitted during the Target Normal Sheath acceleration process explained with reference to FIG. 1, are focused into component beams 510 (also referred to as sub-beams or ribbon-beams) within the profile of the beam envelope 512 of the ion beam emission. For example, in a typical application, the incident short pulse laser irradiation 506 provides a generally laminar rearward emission of protons and ions having a beam envelope 512 that is typically wider than the incident laser envelope 507. In one example, the beam envelope 512 is on the order of several micrometers, e.g., 1–50 microns. By carefully shaping the local curvature of the non-irradiated surface 508 of the target 502 within the profile of the beam envelope 512, component beams 510 are focused within the profile of the entire beam envelope 512 without focusing the entire beam envelope 512. As such, in contrast to the ballistic focusing theoretically illustrated in FIGS. 3A–3D, the shaping of the rear surface according to several embodiments of the invention is not for the purpose of focusing the entire proton and ion beam to create a rasterable spot beam, but to focus component beams 510 within the beam envelope 512 into a desired pattern so that rastering or scanning is unnecessary.

It is noted that the beam envelope 512 is generically that of a beam that includes ions, e.g., includes protons (positive ions). Thus, in the broad sense, the beam emission is referred to as an "ion beam emission" and is meant to include ions without protons and ions including protons in different embodiments. Likewise, the component beams 510 generally comprise ions with or without protons. It is noted that although in the examples provided herein, the ion beam emission includes both ions and protons, one of skill in the art could choose the proper target 502 material and/or deposited ion source material layer 518 that will yield an ion emission without the presence of protons or an ion emission that was substantially entirely protons. Therefore, as used throughout this specification, the term "ion" refers to protons, ions and protons, or ions that are not protons.

In one embodiment, these component beams 510 are on the order of nanometer-scale beams focused within the micrometer-scale profile of the rearward emission (i.e., within the beam envelope 512); therefore, in some embodiments, these component beams 510 may be referred to as nano-focused beams. In one example, 100 nm component beam focusing has been accomplished within a 50 micrometer beam envelope 512, although it should be appreciated that focused beams greater than or less than 100 nm can be achieved through the suitable shaping and scaling of the non-irradiated surface 508 of the target 502. As such, the precise scaling of the component beams 510 is relative to the dimensions of the overall proton and ion beam envelope 512 and the curvature of the non-irradiated surface within the profile of the beam envelope 512.

In one embodiment as illustrated in FIG. 5A, the non-irradiated surface 508 of the target 502 is locally shaped to include multiple peaks 514 and troughs 516 (also referred to as valleys) along the cross section within the profile of the beam envelope 512. As illustrated in FIG. 5A, the surfaces of the non-irradiated surface 508 that are normal to the direction of the short pulse laser 506, i.e., the highest points of the peaks 514 and the lowest points or bases of the troughs 516 emit ions and protons generally in a straight line away from the target foil 502. On the other hand, the surfaces of the non-irradiated surface 508 that are not normal to the direction of the short pulse laser 506, i.e., the sides of the peaks 514 and troughs 516 emit protons and ions that bow inward toward the emission from the base of the trough 516 and then parallel the emission from the base of the trough 516. Thus, component beams 510 are focused at locations generally defined by the position of the bases of the shaped troughs 516. For example, it is noted that the desired shaping of the non-irradiated surface 508 may be patterned into a 1-dimensional pattern (see FIGS. 7–8D) or a 2-dimensional pattern (see FIGS. 6A and 9–10F) in order to produce a desired pattern of component beams 510. Furthermore, it should be understood that the steepness of the peaks 514 and troughs 516 and the distance covered at a peak or trough may be varied in order to produce variously sized component beams and various arrangements of component beams 510.

This is in contrast to ballistic focusing (see FIGS. 3A–3D) as suggested, yet not successfully demonstrated in the art, in that rather than attempting to focus the entire beam envelope of the proton and ion emission into a rasterable beam, component beams 510 are focused within the profile of the beam envelope 512. Furthermore, in some embodiments, through the proper shaping of the non-irradiated surface 508, the focused component beams 510 enable the writing of a complex pattern in a single exposure, without having to scan or raster at all. This could decrease the writing time, or increase the spatial resolution or pattern complexity in future implantation applications.

In further contrast to known RF acceleration and lithographic techniques, through the Target Normal Sheath acceleration process (illustrated and described with reference to FIG. 1), several embodiments of the invention take advantage of the fact that high currents and high current densities are produced in the emission in comparison to conventional RF acceleration techniques.

It is noted that the exact characteristics of the short pulse laser irradiation 506 may be varied as is known in the art. By way of example, the irradiation 506 may have a pulse duration of between about 1 ns and 1 fs, preferably between about 10 ps to 10 fs; an intensity of between about 1 mJ and 10 kJ, preferably between about 100 mJ and 1 kJ, more preferably between about 1–50 J; a focused intensity of between about $10^{18}$ to $10^{21}$ W/cm$^2$; and may have any desired wavelength, e.g., between about 0.1 to 10 microns.

It is noted in FIG. 5A that the beam envelope 512 is generally wider than the incident laser envelope 507. This is due to the electron sheath 110 as described in FIG. 1 that forms about the non-irradiate surface 508 of the target 502. Depending on the implementation and the materials used, the beam envelope 512 may be up to 10 times wider than the incident laser envelope 507. For example, in several cases, the beam envelope 512 was 5 to 7 times wider than the incident laser envelope 507.

Figure 5B:
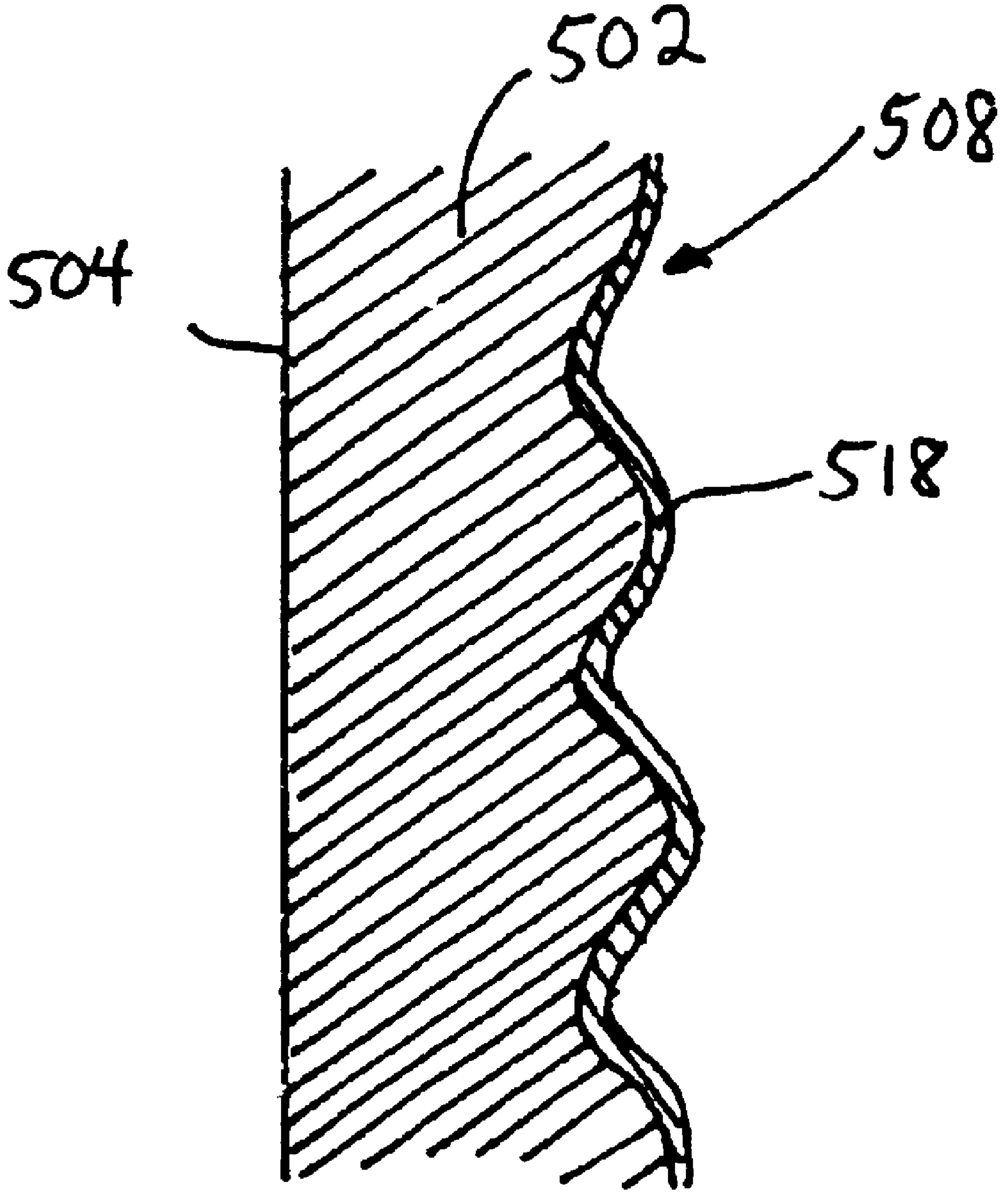
FIG. 5B illustrates a cross sectional view of a portion of a target, such as a conductive target foil, according to another embodiment of the invention.

Referring next to FIG. 5B, a cross sectional view is shown of a portion of a target, such as a conductive target foil, according to another embodiment of the invention. In this embodiment, the non-irradiated surface 508 of the target 502 is coated with an ion source material layer 518 (this is also illustrated as layer 114 in FIG. 1), such that the proton and ion emission may include protons and ions from the purposely deposited ion source material. It is also understood that the emission may include protons and ions from the bulk material or contaminants (such as hydrocarbons or water vapor).

Referring to both FIGS. 5A and 5B, the shaping of the non-irradiated surface 508 within the profile of the beam envelope 512 will dictate the number and scaling of the component beams 510 formed. For example, depending on the width of the beam envelope 512, the materials used and the parameters of the short pulse laser irradiation 506, as few as two and as many as 100 components beams may be focused within the beam envelope 512. Preferably, more than 3 component beams are formed and more preferably, more than 5 component beams are formed with in the beam envelope 512. In one embodiment, for example, between 5 and 20 100 nm component beams are focused within a 50 micron beam envelope 512. It must also be understood that the illustrations of FIGS. 5A and 5B are in the cross sectional view, such that the component beams may be linear, i.e., the peaks 514 and troughs 516 extend linearly (only the cross section is illustrated), or may be point or spot beams, i.e., the troughs 516 resembled wells formed within the non-irradiated surface.

Figure 6A:
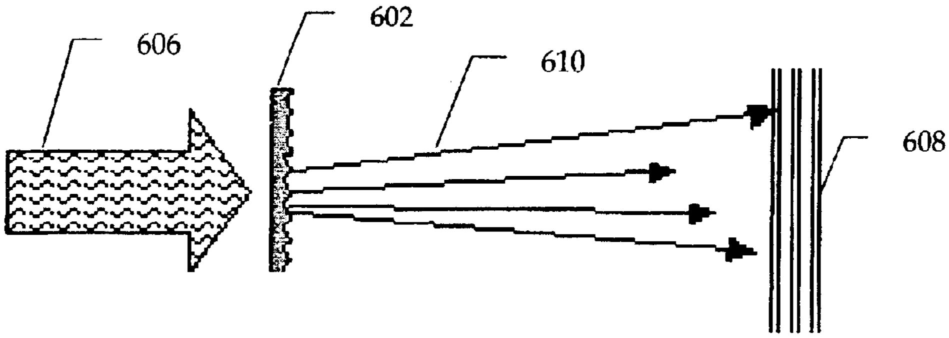
FIG. 6A illustrates one embodiment of the technique of FIGS. 5A–5B including detector film to record the ion and proton emission.
Figure 6B:
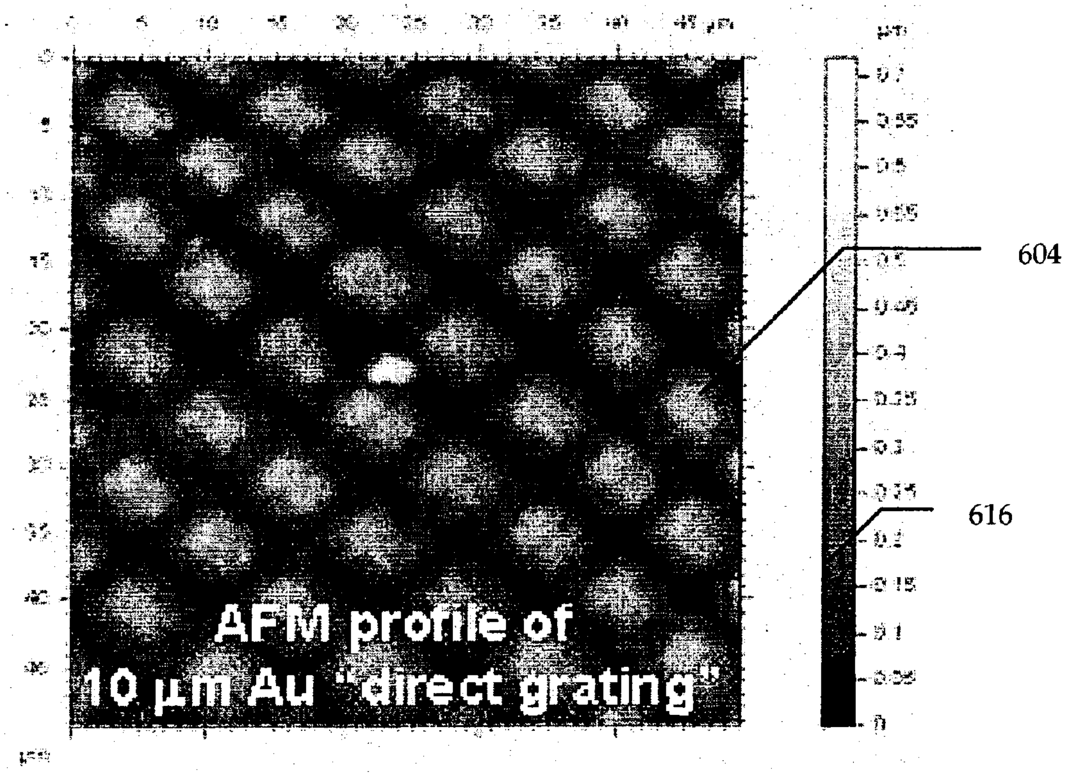
FIG. 6B illustrates an atomic force microscopy (AFM) profile of the non-irradiated surface of the target of FIG. 6A according to one embodiment of the invention.
Figure 6C:
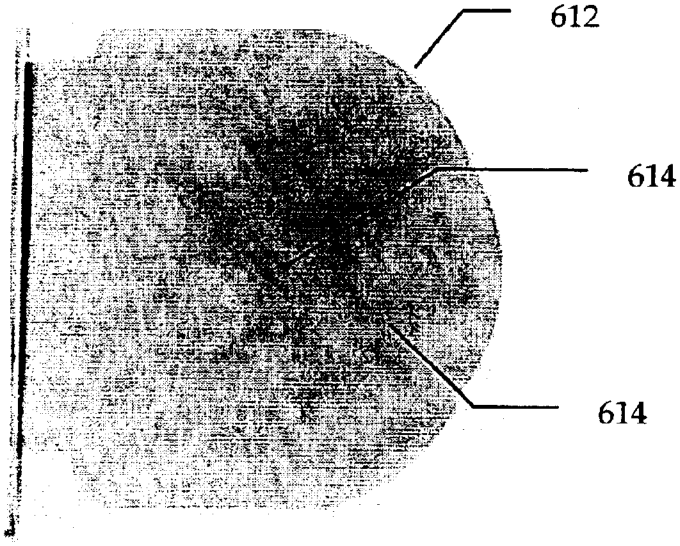
FIG. 6C illustrates a photographic image of the resulting focused beam pattern of the target of FIG. 6B as recorded by the film detector of FIG. 6A according to one embodiment of the invention.

Referring next to FIGS. 6A–6C, FIG. 6A illustrates one embodiment of the technique of FIGS. 5A and 5B including detector film to record the ion and proton emission. Also illustrated in FIG. 6B is an atomic force microscopy (AFM) profile of the non-irradiated surface of the target of FIG. 6A according to one embodiment of the invention. Additionally, FIG. 6C illustrates a photographic image of the resulting focused beam pattern of the target of FIG. 6B as recorded by the film detector of FIG. 6A according to one embodiment of the invention.

According to this embodiment, a target 602 (e.g., a target foil) having a non-irradiated two-dimensional grating surface structure illustrated in the atomic force microscopy (AFM) profile 604 of FIG. 6B was irradiated with short pulse laser irradiation 606, producing a laser accelerated ion beam 610 containing many focused component beams within the profile of the beam envelope. The ion beam pattern was recorded with radiochromatic film densitometry media (film detectors 608) as beam pattern 612 of FIG. 6C. Pattern 612 clearly illustrates the presence of sub-focused or component beams 614 (darker lines) within the profile of the beam envelope. In this embodiment, the target 602 is a 10 μm thick gold having approximately 125 lines/mm in the shape of the non-irradiated surface. In this embodiment, the AFM profile 604 is 50 μm×50 μm and has a depth scale 616 between 0 and 0.7 μm, where 0 μm on the depth scale 616 is a reference point at the deepest point or trough of the non-irradiated surface. As illustrated the AFM profile 604, the shaping resembles an egg-crate like structure in which a series of generally straight parallel linear troughs cross another set of generally straight parallel linear troughs at a diagonal orientation. In between the crossing linear troughs are hemispherical peaks. The darker portions of the AFM profile 604 represent deeper portions (i.e., the troughs) while the lighter portions represent the peaks. Thus, in this embodiment, linear component beams are generally focused from each linear trough (dark area) in the AFM profile 604, which will produce the corresponding crossing linear component beams 614 of beam pattern 612. It is noted that non-irradiated surface of the target shown in profile 604 is referred to as a two-dimensional grating surface structure since the pattern is two dimensional in the plan view of beam pattern 612, i.e., linear patterns extending in two dimensions.

In this embodiment, the laser proton emittance $\epsilon_N$ was observed to be less than about 0.006 π mm-mrad, while conventional RF proton accelerators typically have a laser proton emittance of about 1 π mm-mrad. Thus, the laser-proton beam emittance in this embodiment is about 100 times smaller, thus, about 100 times higher quality than that of conventional RF proton accelerators. It is noted that the emittance may be higher or lower in other embodiments depending on the underlying physics of the ion formation and acceleration in the specific implementation.

In many embodiments of the invention, it is important in the quasineutral expansion physics for component beam focusing that the accelerated ion beam have a low emittance and that the sheath is smooth and monotonically varying. Thus, the use of conductive target foils, such as metallic target foils, for example, gold, aluminum, etc., is preferred because of electron transport limitations in insulating materials.

Figure 2A:
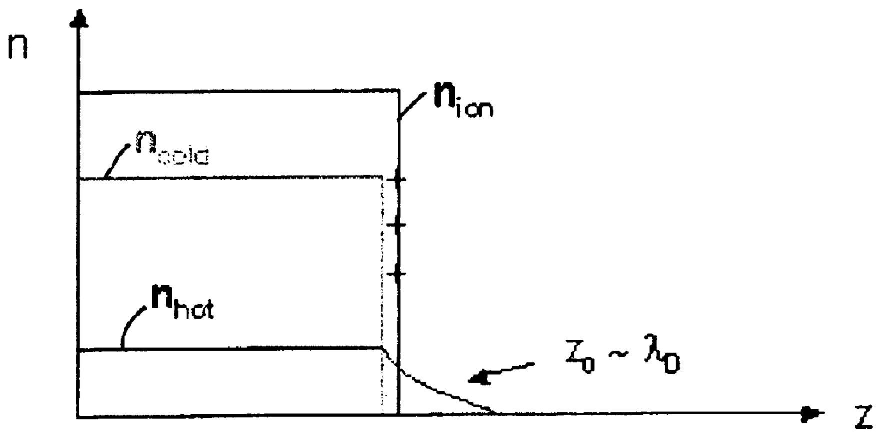
FIGS. 2A–2B illustrate various phases of the fundamental acceleration mechanism illustrated in FIG. 1.

The focusing methods according to several embodiments rely on the early, electrostatic phase of the ion acceleration while there exists a strong-field virtual cathode at the target surface because of the initial hot electron extension into vacuum (see FIG. 2A). While the ion scale-length is small compared to the hot electron sheath scale-length, the electric field is related to the surface charge density of ions, and is directly essentially normal to the non-irradiated surface of the target. One may use Gauss's law to calculate the electric field in the region of the initial, field ionized ion layer. It rises linearly through the ion layer to a maximum value of $E=4\pi\sigma$, where σ is the net ion surface charge density, which is nearly equal to the hot electron density ($n_{hot}$) times the hot electron scalelength ($\partial_x$), i.e., $\sigma=n_{hot}(n_{hot}^{-1}\partial_x n_{hot})^{-1}=n_{hot}^2/\partial_x n_{hot}$. Thus, the electric field at the non-irradiated surface of the target foil, $E_{surf}$, may be expressed as:

$$E_{surf}=4\pi(n_{hot}^2/\partial_x n_{hot})_{init} \qquad \text{(Eq. 3)}$$

Figure 2B:
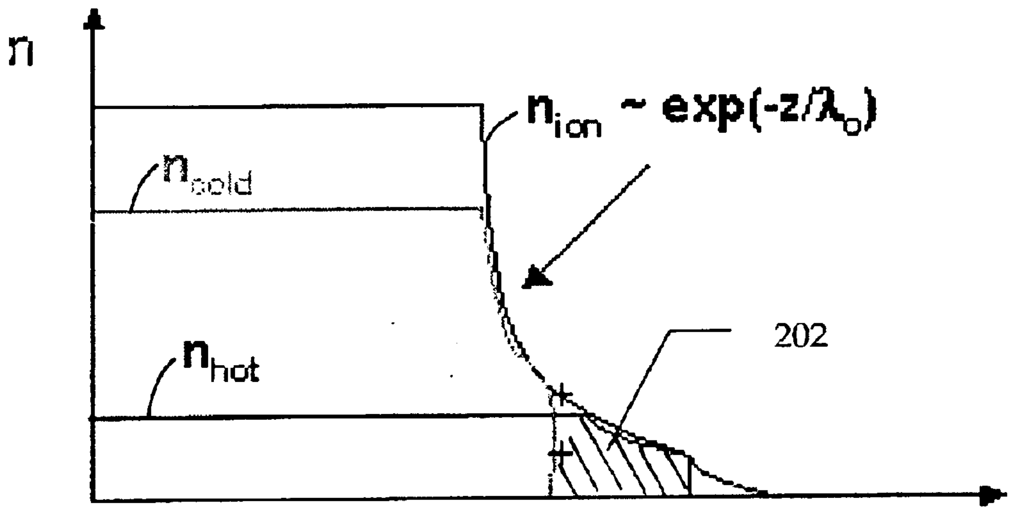
Figures 3A, 3B, 3C:
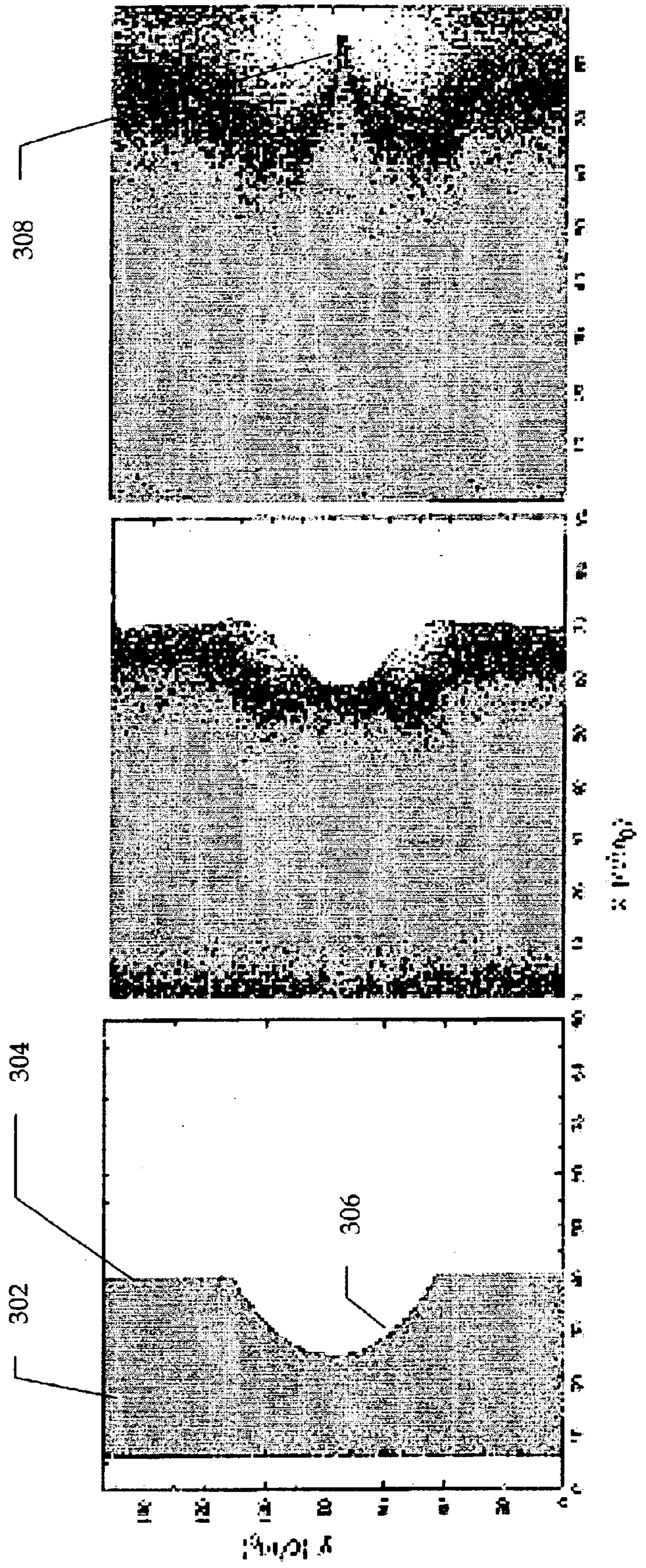
FIGS. 3A–3C illustrate the concept of ballistic focusing of the entire beam envelope of the ion and proton emission of FIG. 1 by shaping the non-irradiated surface of the conductive target foil, as theoretically suggested.
Figure 3D:
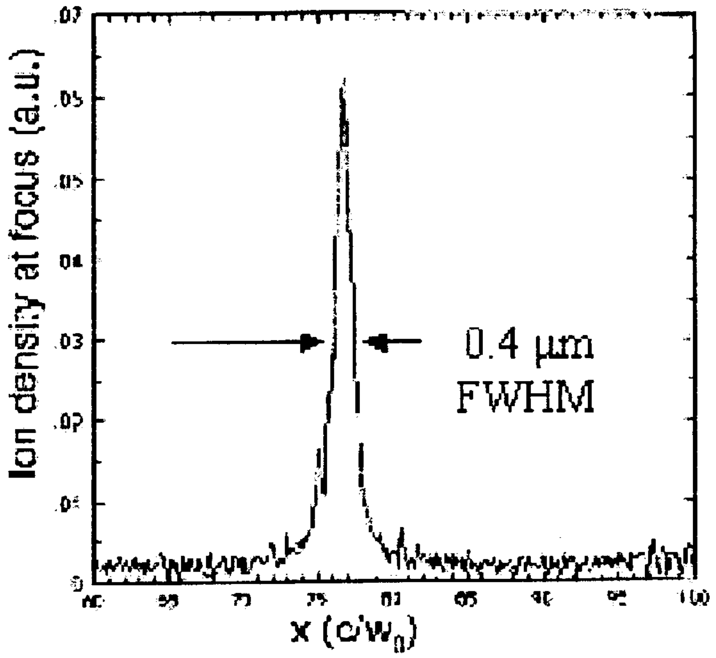
FIG. 3D is a representation of the ion beam density of the ballistically focused beam of FIG. 3C.
Figure 4:
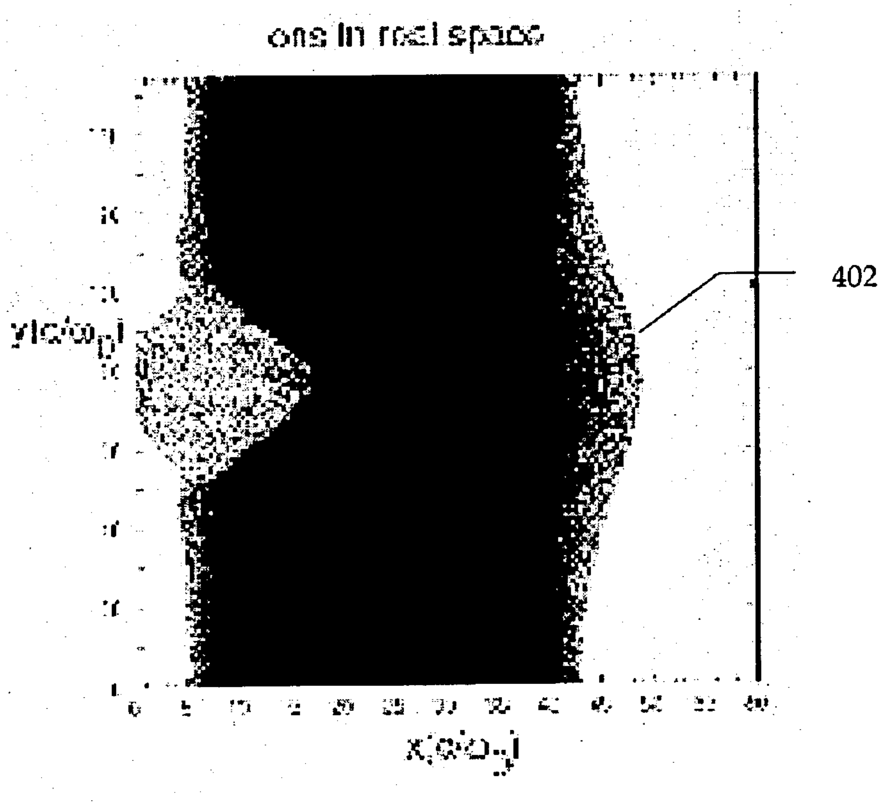
FIG. 4 illustrates impediments to the implementation of the ballistic focusing theoretically illustrated in FIGS. 3A–3D.

The thickness of the initial ion layer is equal to the surface charge density divided by the ion density, which for the initial solid density is of order 1 nanometer. The surface charge electric field is normal to the surface charge distribution averaged over a spatial scale comparable to the layer thickness. Therefore the initial acceleration follows the surface normal at a precision of a few nanometers. As the ion front expands (see FIG. 1), the electric field felt by the ions smoothly transitions from the surface charge, "virtual cathode" field illustrated in FIG. 2A (Eq. 3), to the quasineutral expanding plasma field illustrated in FIG. 2B (Eq. 2). This transition is analogous to an accelerator arrangement in which an electrostatic injector ("virtual cathode") produces and focuses a beam into a traveling wave accelerator (expanding quasineutral plasma). Unlike conventional accelerators, this method leads to naturally charge-neutralized beams which inhibit space charge driven expansion. Simple consideration suggests that this occurs over a spatial scale of approximately 1 micrometer, and a time scale of approximately a few femtoseconds, hence extremely low transverse emittance can be preserved.

The physical process of laser-virtual-cathode formation, followed by quasineutral expansion, is the basis of several embodiments of the invention. By shaping the initial rear, non-irradiated target surface, it is possible to focus portions of the MeV proton and ion beams to component beams within the profile of the proton and ion emission beam envelope, for example, to sub micrometer spatial scales within a micrometer beam envelope.

The following are design considerations when implementing several embodiments of the invention. First, in one embodiment, the material selected for the target should be a conducting bulk target foil material. This material may be a metallic or non-metallic material. This allows the formation of a smooth, monotonic hot electron sheath (e.g., sheath 110) to produce laminar, low-emittance expansion of the beam envelope during the quasineutral expansion phase of the process. Second, the target (e.g., conductive foil) should be only a few microns thick, for example, between 5 and 15 $\mu$m, for example, 10 $\mu$m. In other words, the target should be thick enough to maintain rear surface quality during laser pre-pulse. Thus, it is understood that the thickness of the target may vary depending on the application; however, the thickness of the target should be sufficient to maintain rear surface quality during laser irradiation. And third, the non-irradiated surface should have a micron scale surface structure (e.g., as illustrated in FIGS. 5A and 6B) to produce "lens" focusing in the "virtual cathode" phase of acceleration. However, it is understood that the non-irradiated surface need not have a micron scale surface structure, but that the non-irradiated surface should have a surface structure defined within the dimensions of the beam envelope of the incident laser, i.e., on a smaller scale than that of the beam envelope 512.

EXAMPLE 1

Figure 7:
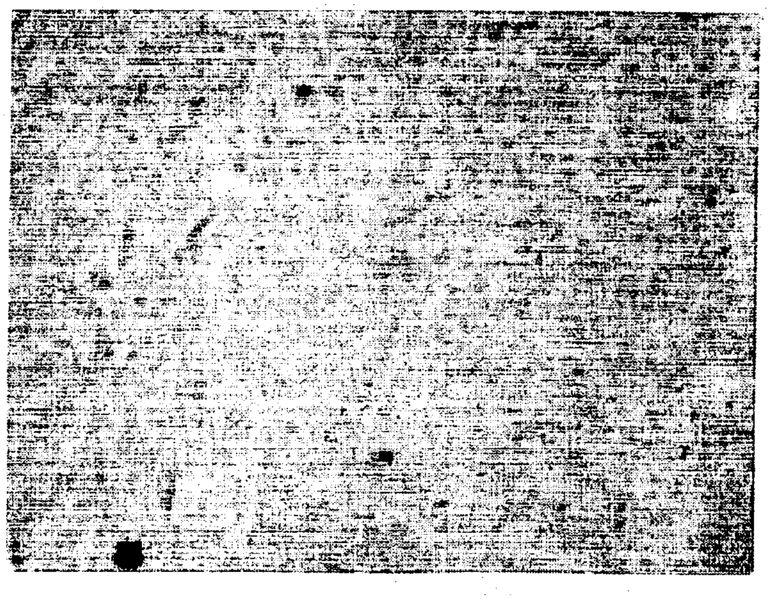
FIG. 7 illustrates a photomicrograph of a 1-dimensional grating structure of the rear or non-irradiated surface of a target in accordance with one embodiment of the invention.
Figures 8A, 8B, 8C, 8D:
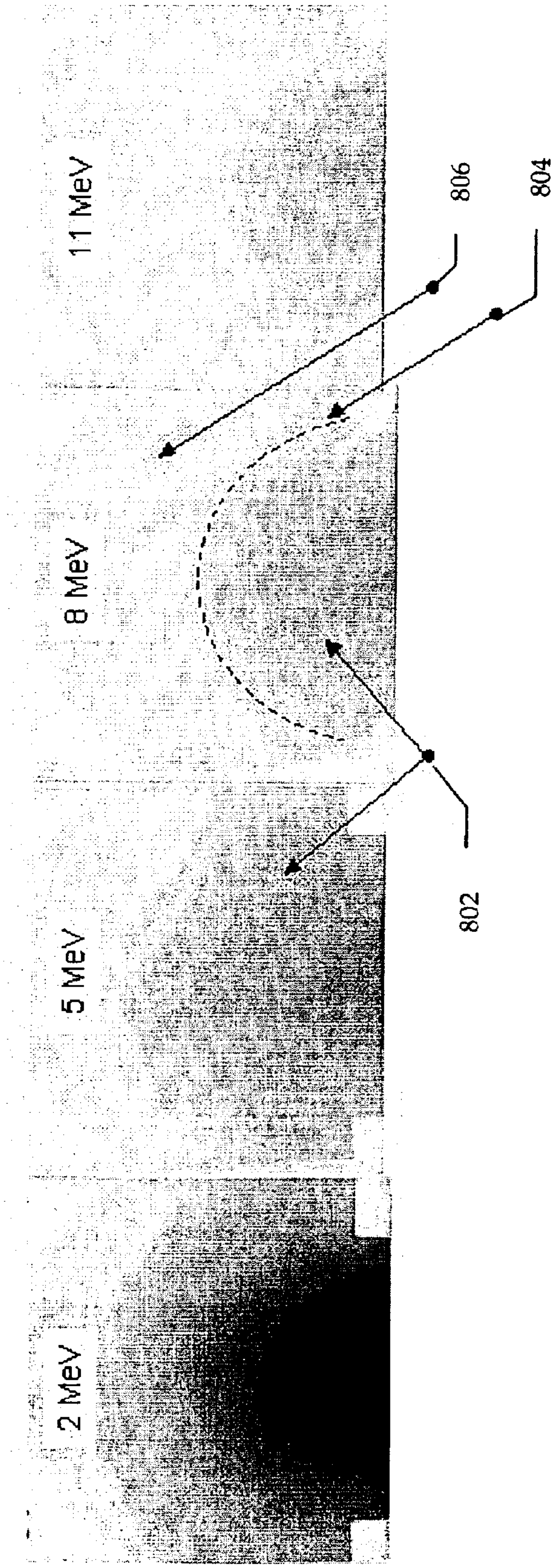
FIGS. 8A–8D illustrate photographic images of the accelerated proton and ion emission using radiochromic film (RCF) densitometry media using the target of FIG. 7, in accordance with one embodiment of the invention.

A target in accordance with one embodiment of the invention was produced from gold foils, of 10 micron thickness, by vacuum deposition and electroplating on a structured mandrel. First, a copper mandrel was produced with machining marks, coated electroplated with gold, etched away the copper to produce a one-dimensional grating structure having 5 micron line spacing and approximately 300 nm depth. This grating structure is the non-irradiated surface of the target material. A photomicrograph of this 1-dimensional grating structure is illustrated in FIG. 7, which clearly illustrates the presence of horizontal lines. The grating structure of FIG. 7 is referred to as a one-dimensional grating structure since the pattern results in multiple lines formed in the grating structure extending in one dimension, e.g., horizontally. In other words, parallel linear troughs and peaks are formed in the non-irradiated surface of the target.

To test focusing and patterning with the target structure in Example 1, a 100 TW short pulse laser was used to test the sub-focusing or nano-focusing properties within the beam envelope. In this embodiment, a 20 J pulse of 1 micron laser light, in a 350 fs pulse, (i.e., short pulse laser 606) was focused to approximately an 8 micron diameter (i.e., an incident laser envelope 507 of about 8 microns) on the front (non-structured) surface of the target 602. The accelerated protons and ions were recorded in radiochromic film (RCF) densitometry media (e.g., detector film 608), located 68 mm downstream of the target. The proton energy resolved images (see FIGS. 8A–8D) show the presence of the nano-focused component beams 802. It is noted that the component beams are most easily viewable in FIGS. 8B and 8C. Due to the quasineutral expansion phase, the surface image is magnified approximately 1000× from the rear surface sheath structure. Component beams 802, corresponding to nano-scale focusing from the troughs in the shaped non-irradiated surface of the target, reveal in intrinsic spatial resolution (1-D) at the termination of the "virtual cathode" phase of acceleration of about 100 nm, rms. As is illustrated in the photographic images of FIGS. 8A–8D, at different energies, the presence of proton and ion component beams 802 (e.g., the component beams 510 of FIG. 5A) is detected within the profile of the beam envelope 804 (e.g., the beam envelope 512 of FIG. 5A). In this embodiment, the proton and ion component beams 802 are 200 times magnified at 5 $\mu$m spacing and less than 100 nm wide at the source. Further illustrated is the electron halo 806 from the electrons that produce the sheath that ionizes the protons and ions from the rear surface of the target 602. The survival of these structures during the drift to the RCF detector plane implies a transverse emittance for 10 MeV protons of less than 0.006 $\pi$ mm-mrad. In these tests, the accelerated protons and ions produced in photographic images in FIGS. 8A–8D have energies of 2 MeV, 5 MeV, 8 MeV and 11 MeV, respectively.

EXAMPLE 2

In order to produce a target of 10 micron thickness from gold foils in accordance with another embodiment of the invention, vacuum deposition and electroplating were done on a structured mandrel. An optically flat glass substrate was coated with approximately a 500 nm thick photo-resist. For demonstration purposes, a two-dimensional grating image was exposed onto the resist, by the double exposure of a 1-dimensional grating (having 8 micron repeat), and rotated for the second exposure by approximately 90 degrees. The resist was etched, and then baked. A thin coating of gold was evaporated onto the photoresist structure, and then approximately 10 microns of gold were electroplated onto this layer. Finally, the photoresist was dissolved by immersion of the gold-covered substrate in a final etch solution, allowing the 10 micron thick gold layer to be removed from the substrate. Thus, the 2-dimensional grating structure was thereby directly transferred to the gold foil. This grating structure may be referred to as a "direct grating". Atomic force microscopy (AFM) was used to map the 2-dimensional grating structure of the rear surface of this gold foil and is illustrated as a perspective view in FIG. 9, in comparison to the plan view AFM of FIG. 6B. Again, it is noted that the parallel and crossing linear troughs are formed in the grating structure while the peaks resemble hemispherical peaks or mounds formed between respective linear troughs.

In one variation referred to as a "transfer grating", rather than coating the photoresist with a thin coating of gold, a coating of copper is evaporated onto the photoresist structure, which is then removed. The removed copper structure is coating with gold and then removed to form the gold "transfer" grating. However, this process requires additional steps and is not preferred. Although not shown, an atomic force microscopy (AFM) map of such a transfer grating would look very similar to the direct grating shown in FIG. 9; however, the edges would be slightly smoother.

Figure 9:
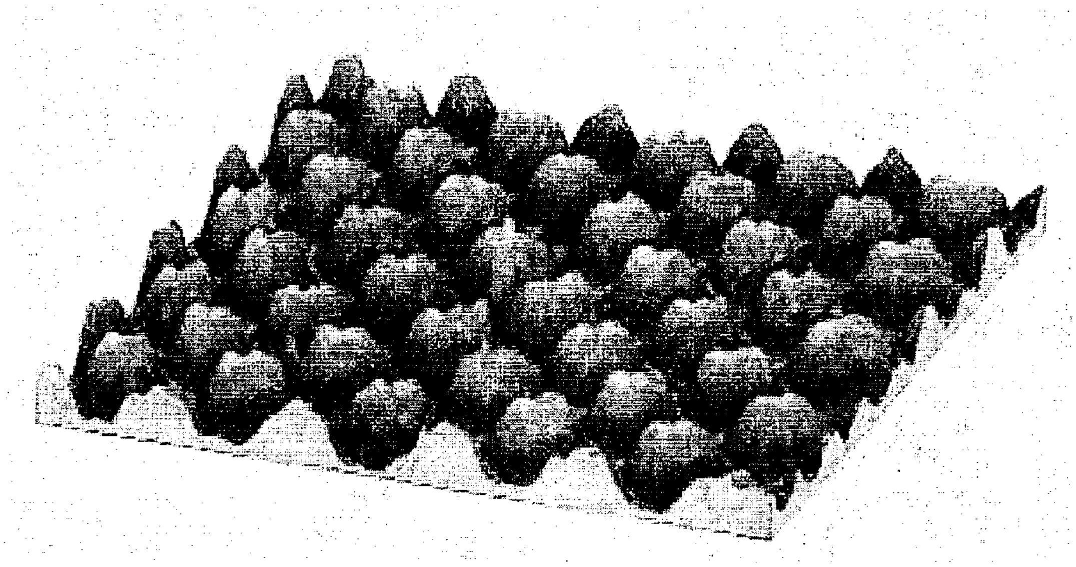
FIG. 9 illustrates a perspective view of an atomic force microscopy (AFM) profile of the non-irradiated surface of a target in accordance with another embodiment of the invention.
Figures 10A, 10B, 10C, 10D, 10E, 10F:
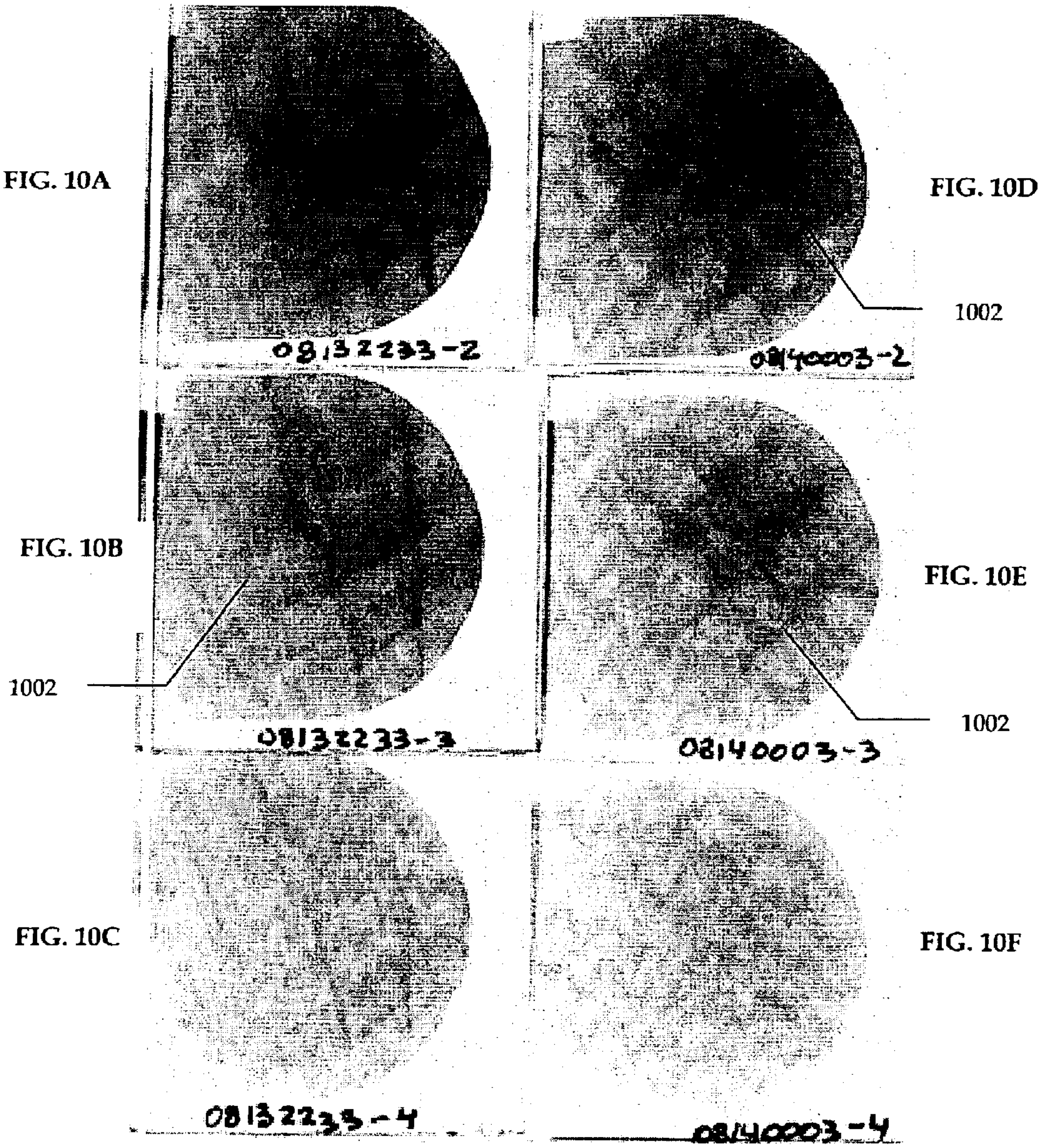
FIGS. 10A–10F illustrate photographic images of the accelerated proton emission using radiochromic film (RCF) densitometry media using a transfer grating and the direct grating target of FIG. 9, in accordance with another embodiment of the invention.

As illustrated in FIGS. 10A–10F, photographic images are shown of radiochromatic film densitometry media (e.g., detector film 608) located approximately 71 mm from a transfer grating target foil and a direct grating target foil illustrated in FIG. 9. In this embodiment, a 20 J pulse of 1 micron laser light, in a 350 fs pulse, (i.e., short pulse laser 606) was focused to approximately an 8 micron diameter (i.e., an incident laser beam envelope of about 8 microns) on the front (non-structured) surface of the target 602. FIGS. 10A–10C illustrate the image at the detector film 608 using the transfer grating similar to that of FIG. 9 for proton energies of 5 MeV, 8 MeV and 11 MeV, respectively, while FIGS. 10D–10F illustrate the image using the direct grating shown in FIG. 9 for proton energies of 5 MeV, 8 MeV and 11 MeV, respectively. Again, the presence of proton and ion component beams 1002 focused within the profile of the beam envelope and the resulting pattern are clearly discernable as dark lines. Again, the results imply a transverse emittance for 10 MeV protons of less than 0.006 $\pi$ mm-mrad.

It is noted that the direct grating (FIGS. 10D–10F) results in a cleaner image that a corresponding transfer grating (FIGS. 10A–10C) and is thus preferred. For example, the images of FIGS. 10D–10F illustrate a cleaner pattern of crossing lines that the images of FIGS. 10A–10C.

It is understood that although the specific embodiments illustrate describe shaping the non-irradiated surfaces of a conductive target to produce generally straight linear component beams in various patterns, the exact shape of the non-irradiated surface may be formed so as to produce non-straight linear component beams, e.g., curved, arced, circular, etc. For example, rather than crossing patterns of parallel linear component beams, patterns of curved component beams could be formed to create the desired pattern. As such, the pattern to be created would be formed within the non-irradiated surface of the target within the beam envelope of the ion emission.

Application of several embodiments of this method for ion implantation would remove the constraints of the beam focusing and rastering to the requirement for target fabrication. Accordingly, the techniques presented herein produce high spatial resolution proton or ion beam patterns, whose "line width" can be much smaller than the lithographic patterning of the target, but whose spacing is limited to the lithographic technique. That is, in tests, 100 nm scale component beams were produced with micron scale inter-beam spacing. For example, in one embodiment, lithographically produced microstructures in the target foil were 5 microns wide separated by 5 microns, which produced component beams (e.g., component beams 510) that were 100 nm wide separated by 5 microns. However, it is understood that these parameters may be varied in accordance with the specific application and desired pattern. As demonstrated herein, it is possible to generate a complete, complex pattern, over an area comparable to the entire electron plasma sheath (e.g., beam envelope), in a single exposure. In this demonstration, that is a circular area of approximately 50 microns in diameter.

In other embodiments, other potential uses include (destructive) surface microscopy, by imaging the spatial distribution of the accelerated protons or ions; laser-driven surface-ion emission spectroscopy; and structuring of a plasma ion beam for the purpose of providing fiducial marks. The latter use is anticipated to find broad application in fundamental research. One example of which would be to improve the conventional radiography of either static objects, or strong electromagnetic fields in plasmas by using several embodiments of the present technique to produce fiducial marks in the probing beam. The presence of the fiducial marks may allow for complete reconstruction of the radiographed object.

Figure 11:
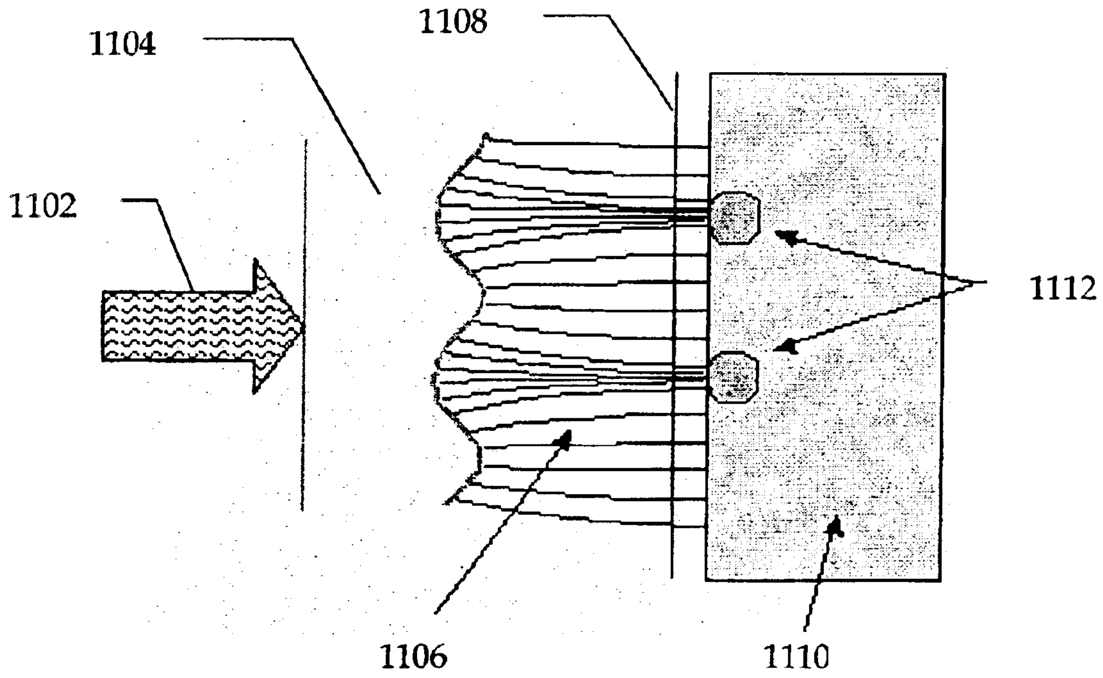
FIG. 11 illustrates another embodiment of the invention utilizing a debris shield positioned between a target or an ion source material and an implantation material.

Referring next to FIG. 11, a diagram is shown illustrating another embodiment of the invention. As illustrated, short pulse laser 1102 irradiates a target 1104 (e.g., a target foil) in accordance with one embodiment and produces a proton and ion beam envelope emitting from the rear surface of the target 1104. Again, due to the shaping of the rear surface of the target 1104, focused component beams 1106 are produced. A debris shield 1108 is positioned between the ion source material (target 1104) and an implantation material 1110 (also referred to as an implantation sample). The debris shield 1108 acts to shield the implantation material 1110 from debris from the vaporization of the target 1104. Also illustrated are implanted ion damage regions 1112 of the implantation material 1110 corresponding to the focused component beams 1106.

While the invention herein disclosed has been described by means of specific embodiments and applications thereof, numerous modifications and variations could be made thereto by those skilled in the art without departing from the scope of the invention set forth in the claims.

What is claimed is:

1. A method for use with laser accelerated ion beams comprising:

irradiating a surface of a target with pulsed laser irradiation to produce an electron plasma emission on a non-irradiated surface of the target, the electron plasma emission producing an ion beam emission on the non-irradiated surface, the ion beam emission having a beam envelope; and focusing ions of the ion beam emission into a plurality of component beams within the beam envelope as a result of the shape of the non-irradiated surface of the target.

2. The method of claim 1 wherein the ion beam emission comprises protons and wherein the focusing step comprises focusing protons of the ion beam emission into the plurality of component beams.

3. The method of claim 1 wherein the focusing step comprises focusing the ions into a plurality of linear component beams.

4. The method of claim 1 wherein the irradiating step produces the ion beam emission, the ion beam emission including ions from an ion source layer formed on the non-irradiated surface of the target.

5. The method of claim 1 wherein ions released from the non-irradiated surface are substantially focused toward ions released from a respective base of a trough formed in the non-irradiated surface.

6. The method of claim 5 wherein the trough comprises a linear trough.

7. The method of claim 1 wherein the non-irradiated surface is shaped to include at least one trough in the non-irradiated surface, a base of a respective trough defining a location of a respective component beam.

8. The method of claim 1 wherein the focusing comprises focusing the ions into the plurality of component beams as a result of a pattern of troughs and peaks formed within the non-irradiated surface within the profile of the beam envelope.

9. The method of claim 1 wherein the focusing comprises focusing the ions of the ion beam emission into nanometer-scale component beams within a micrometer-scale beam envelope of the ion beam emission as a result of the shape of the non-irradiated surface of the conductive foil.

10. The method of claim 1 wherein the focusing forms a pattern corresponding to the shape of the non-irradiated surface of the target.

11. The method of claim 1 further comprising contacting an implantation material with the plurality of component beams to create a pattern on the implantation material.

12. The method of claim 11 wherein the pattern is created on the implantation material without scanning the ion beam emission.

13. The method of claim 11 further comprising shielding the implantation material from debris resulting from the production of the electron plasma emission and the ion beam emission.

14. The method of claim 1 wherein the irradiating step comprises irradiating the surface of a conductive foil.

15. The method of claim 1 wherein the irradiating produces a substantially charge neutralized ion beam and electron plasma emission having an emittance less than 0.006 $\pi$ mm-mrad.

16. A device for focusing laser accelerated ion beams comprising:

means for irradiating a surface of a target with pulsed laser irradiation to produce an electron plasma emission on a non-irradiated surface of the target, the electron plasma emission producing an ion beam emission on the non-irradiated surface, the ion beam emission having a beam envelope; and means for focusing ions of the ion beam emission into a plurality of component beams within the beam envelope as a result of the shape of the non-irradiated surface of the target.

17. A device for focusing laser accelerated ion beams comprising:

a target comprising:

a surface configured to be irradiated with pulsed laser irradiation; and a non-irradiated surface configured to produce an electron plasma emission upon the irradiation of the surface, the electron plasma emission producing an ion beam emission having a beam envelope;

wherein a portion of the non-irradiated surface is shaped to focus ions of the ion beam emission into respective component beams within the beam envelope.

18. The device of claim 17 wherein the ion beam emission comprises protons and wherein the non-irradiated surface is shaped to focus the protons into the respective component beams within the beam envelope.

19. The device of claim 17 wherein the portion of the non-irradiated surface is shaped to focus ions into respective linear component beams within the beam envelope.

20. The device of claim 17 further comprising an ion source layer formed on the non-irradiated surface.

21. The device of claim 17 wherein the portion of the non-irradiated surface is shaped to include at least one trough formed in the non-irradiated surface, a base of a respective trough defining a location of a respective component beam.

22. The device of claim 21 wherein one or more troughs comprise a linear trough.

23. The device of claim 17 wherein the portion of the non-irradiated surface comprises a pattern of troughs and peaks for focusing the ions into a desired pattern of component beams.

24. The device of claim 17 wherein the portion of the non-irradiated surface is shaped to focus the ions into respective nanometer-scale component beams within a micrometer-scale beam envelope of the ion beam emission.

25. The device of claim 17 further comprising an implantation material positioned to receive the respective of component beams to create a pattern on the implantation material.

26. The device of claim 25 wherein the pattern is created on the implantation material without scanning the ion beam emission.

27. The device of claim 25 further comprising a debris shield positioned in between the target and the implantation implantation in the path of the respective component beams.

28. The device of claim 17 wherein the portion of the non-irradiated surface that is shaped to focus the ions covers substantially the entire dimensions of the beam envelope.

29. The device of claim 17 wherein the target comprises a conductive foil.

30. The device of claim 17 wherein upon the irradiation of the surface, a substantially charge neutralized ion beam and electron plasma emission is produced having an emittance less than 0.006 $\pi$ mm-mrad.

* * * * *

UNITED STATES PATENT AND TRADEMARK OFFICE

CERTIFICATE OF CORRECTION

PATENT NO. : 6,852,985 B2
DATED : February 8, 2005
INVENTOR(S) : Cowan et al.

It is certified that error appears in the above-identified patent and that said Letters Patent is hereby corrected as shown below:

Column 14,
Line 34, before "in" delete "implantation"

Signed and Sealed this

Seventh Day of June, 2005

JON W. DUDAS
*Director of the United States Patent and Trademark Office*